(12) United States Patent
Radovanov et al.

(10) Patent No.: US 7,309,997 B1
(45) Date of Patent: Dec. 18, 2007

(54) MONITOR SYSTEM AND METHOD FOR SEMICONDUCTOR PROCESSES

(75) Inventors: Svetlana B. Radovanov, Marblehead, MA (US); Edward Macintosh, Amesbury, MA (US); Gary Ayers, Woburn, MA (US); Philip Corey, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1409 days.

(21) Appl. No.: 09/662,471

(22) Filed: Sep. 15, 2000

(51) Int. Cl.
*G01R 31/26* (2006.01)

(52) U.S. Cl. ......................... 324/763; 324/750
(58) Field of Classification Search ................ 324/763, 324/750, 158.1, 764, 755, 765, 754, 522, 324/530; 326/102; 438/18, 14
See application file for complete search history.

(56) References Cited

U.S. PATENT DOCUMENTS

| | | |
|---|---|---|
| 4,021,675 A | 5/1977 | Shifrin |
| 4,135,097 A | 1/1979 | Forneris et al. |
| 4,228,358 A | 10/1980 | Ryding |
| 4,234,797 A | 11/1980 | Ryding |
| 4,361,762 A | 11/1982 | Douglas |
| 4,421,988 A | 12/1983 | Robertson et al. |
| 4,433,247 A | 2/1984 | Turner |
| 4,463,255 A | 7/1984 | Robertson et al. |
| 4,539,217 A | 9/1985 | Farley |
| 4,587,433 A | 5/1986 | Farley |

(Continued)

FOREIGN PATENT DOCUMENTS

| | | |
|---|---|---|
| EP | 0 532 283 B1 | 3/1993 |
| EP | 0 860 854 A1 | 8/1998 |
| EP | 0 994 203 A2 | 4/2000 |

OTHER PUBLICATIONS

Basra, et al., "A Study of Wafer and Device Charging During High Current Ion Implantation", Varian Research Center, pp. 1–11.

Eernisse, E.P., et al., "Ion Beam Profile Monitor," Rev. Sci. Instrum., vol. 46, No. 3 pp. 266–268 (Mar. 1975).

Fang et al., "Evaluation of Different Wafer Charging Metrology Protocols for Thin Dielectrics", Varian Semiconductor Equipment Associates, Inc., pp. 1–4.

Jamba, D.M., "Dosimetry Measurement In Ion Implanters," Nuclear Instruments and Methods 189, pp. 253–263, North Holland Publishing Company (1981).

(Continued)

*Primary Examiner*—Kamand Cuneo
*Assistant Examiner*—Trung Q. Nguyen

(57) ABSTRACT

A monitor system and method for characterizing semiconductor processes including ion implantation processes is provided. The system includes a test wafer which has a plurality of sensors formed on its surface. The test wafer may be loaded into the process chamber of a process system and exposed, for example, to an implant. During implantation, electrical signals may be transmitted from the sensor to circuitry external of the chamber to evaluate a variety of ion beam and/or wafer properties. The property data may be displayed in real-time with the implant process so that processing parameters may be adjusted accordingly. The monitor system may be used, in particular, to determine properties related to beam and wafer surface charging which can provide an assessment of the efficiency of beam charge neutralization processes.

19 Claims, 12 Drawing Sheets

U.S. PATENT DOCUMENTS

| | | | |
|---|---|---|---|
| 4,595,837 | A | 6/1986 | Wu et al. |
| 4,744,938 | A | 5/1988 | Ruddy |
| 4,751,393 | A | 6/1988 | Corey, Jr. et al. |
| 4,764,394 | A | 8/1988 | Conrad |
| 4,786,814 | A | 11/1988 | Kolondra et al. |
| 4,937,205 | A | 6/1990 | Nakayama et al. |
| 5,015,493 | A | 5/1991 | Gruen |
| 5,055,715 | A * | 10/1991 | Inaba .................. 326/16 |
| 5,126,163 | A | 6/1992 | Chan |
| 5,184,398 | A | 2/1993 | Moslehi |
| 5,206,180 | A | 4/1993 | Yoshida |
| 5,266,890 | A | 11/1993 | Kumbasar et al. |
| 5,286,676 | A | 2/1994 | Kruger et al. |
| 5,289,010 | A | 2/1994 | Shohet |
| 5,350,926 | A | 9/1994 | White et al. |
| 5,354,381 | A | 10/1994 | Sheng |
| 5,374,456 | A | 12/1994 | Matossian et al. |
| 5,452,177 | A | 9/1995 | Frutiger |
| 5,572,038 | A | 11/1996 | Sheng et al. |
| 5,653,811 | A | 8/1997 | Chan |
| 5,654,043 | A | 8/1997 | Shao et al. |
| 5,658,423 | A | 8/1997 | Angell et al. |
| 5,711,812 | A | 1/1998 | Chapek et al. |
| 5,728,253 | A | 3/1998 | Saito et al. |
| 5,814,823 | A | 9/1998 | Benveniste |
| 5,825,035 | A | 10/1998 | Mizumura et al. |
| 5,861,632 | A | 1/1999 | Rohner |
| 5,883,391 | A | 3/1999 | Adibi et al. |
| 5,911,832 | A | 6/1999 | Denholm et al. |
| 6,020,592 | A | 2/2000 | Liebert et al. |
| 6,028,324 | A | 2/2000 | Su et al. |
| 6,050,218 | A | 4/2000 | Chen et al. |
| 6,492,189 | B1 * | 12/2002 | Yamaguchi .................. 438/18 |

OTHER PUBLICATIONS

Jamba, D.M., "Semiconductor Measurement Technology: Some Aspects of Dose Measurement for Accurate Ion Implantation," NBS Special Publication 400–39, pp. 1–36 (Issued Jul. 1977).

Jamba, D.M., "Secondary Particles Collection in Ion Implantation Dose Measurement," Rev. Sci. Instrum., vol. 49, No. 5, pp. 634–638 (May 1978).

Jones, E.C. et al., "Plasma Doping Dosimetry," IEEE Trans. on Plasma Science, vol. 25, No. 1, Feb., 1997.

Kellerman, P., "PIII Dosimetry," EATON, Implant Systems Division, Apr. 1999, pp. 1–13.

Kondoh, E. et al., "In–Line Monitoring of HF–Last Cleaning of Implanted and Non–Implanted Silicon Surfaces by Non–Contact Surface Charge Measurements", *Electrochemical Society Proceedings*, vol. 97–35, pp 221–228.

Lukaszek, W. et al., "Charging Studies With Charm," *Nuclear Instruments and Methods in Physics Research*, pp 143–147 (1991).

Lukaszek, et al., "Measurement of Process Induced Wafer Potentials", Ion Implant Technology—92, pp. 645–650, (1993).

Mack, M.E. et al., "Wafer Charging and Beam Interactions in Ion Implantation", *Nuclear Instruments and Methods in Physics Research*, pp 405–411 (1985).

McCarthy, et al., "Applications of a New Wafer Surface Charge Monitor", EOS/ESD Symposium Proceedings, pp. 182–185 (1990).

McKenna, C.M., "High Current Dosimetry Techniques," Radiation Effects, vol. 44, pp. 93–110 (1979).

Mehta, et al., "Charge Control in a Ribbon Beam High Current Ion Implanter", Varian Ion Implant Systems, pp. 1–4.

Mehta, et al., "Comparison of Positive and Negative Charging with CHARM–2 Wafers and Antenna Structures", Varian Ion Implant Systems, pp. 1–9.

Shauly, E.N. et al., "In–Situ Control of Wafer Charge Neutralization During High Current Ion Implants", *Materials Research. Society.*, vol. 316, pp 633–638 (1994).

Sinclair et al., "Gate Oxides in High Current Implanters: how do they survive?", Nuclear Instruments and Methods of Physics Research B55, pp. 115–123 (1991).

Yoshida, Y. et al., "Quantitative Monitoring of Charging–Up Employing EEPROM Device", pp 110–117.

Patent Abstract of Japan, Publication No. 10092886, Hitachi Ltd.

* cited by examiner

MONITOR SYSTEM AND METHOD FOR SEMICONDUCTOR PROCESSES

FIELD OF INVENTION

The invention relates generally to semiconductor processing and, more particularly, to a monitor system and method used to characterize a semiconductor process such as ion implantation.

BACKGROUND OF INVENTION

Semiconductor materials are extensively used in many electronic applications. Semiconductors may be used as substrate materials which are processed using conventional techniques to form, for example, a variety of different semiconductor devices.

Ion implantation is a conventional process for introducing dopants into semiconductor materials. Oftentimes, semiconductor devices include doped regions which have an increased conductivity relative to the substrate material. Typically, during ion implantation, a desired dopant material is ionized in an ion source to form positive ionic species and electrons. The positive ionic species are accelerated at a selected energy to form an ion beam. The beam is directed at the surface of the wafer and the impinging ions penetrate into the bulk semiconductor material to form a region of the desired conductivity.

It generally is desirable to utilize an ion beam having a neutral space charge, wherein the charge from positive ionic species is balanced with the charge from electrons. Beams that have do not have a neutral space charge (i.e., beams that have either a positive or a negative space charge) may be difficult to transport and also may cause charge to build up on the wafer surface which can damage devices in the wafer. In some cases, ion sources generate beams that have a net positive charge. In particular, ion beams having a high beam current and/or a large area may have a net positive charge.

When beams having a net positive charge are generated, beam neutralization techniques may be employed. One conventional neutralization technique involves introducing electrons into the beam to compensate for the net positive charge. The electrons may be introduced downstream of the ion source, for example, using a plasma flood gun system. The net flux and energy of electrons emerging from the plasma flood gun, and the ion beam potential and charge distribution in the beam are important in determining the efficiency of the charge neutralization.

Implantation processes, and specifically the effect of charge neutralization techniques, have been characterized by measuring damage on devices resulting from an implant. Such characterization techniques involve exposing a test wafer to an implant step, followed by measuring the breakdown voltage and/or leakage current of devices on the wafer. In such techniques, the wafers must be removed from the process chamber of the implantation system to make the measurements, and the data is obtained after the implantation process. Thus, adjusting the system in response to the data may be difficult and time consuming.

Accordingly, there is a need for improved techniques that characterize semiconductor processes such as ion implantation and, particularly, techniques that measure the efficiency of charge neutralization methods.

SUMMARY OF INVENTION

The invention provides a monitor system and method for characterizing semiconductor processes including ion implantation processes. The system includes a test wafer which has a plurality of sensors formed on its surface. The test wafer may be loaded into the process chamber of a process system and exposed, for example, to an implant During implantation, electrical signals may be transmitted from the sensor to circuitry external of the chamber to evaluate a variety of ion beam and/or wafer properties. The property data may be displayed in real-time with the implant process so that processing parameters may be adjusted accordingly. The monitor system may be used, in particular, to determine properties related to beam and wafer surface charging which can provide an assessment of the efficiency of beam charge neutralization processes.

In one aspect, the invention provides a monitor system for a semiconductor process. The monitor system includes a test wafer including at least one sensor. The test wafer is positionable on a supporting structure in a process chamber of a semiconductor processing system. The monitor system further includes an interface including at least one contact electrically connectable to the sensor when the test wafer is positioned on the supporting structure. The monitor system further includes circuitry electrically connectable to the contact and designed to process signals transmitted from the sensor.

In another aspect, the invention provides a monitor system for a semiconductor process including a test device positionable within a process chamber of an ion implantation system using a wafer handling system. The test device is able to transmit signals to circuitry of the monitor system in real-time with the semiconductor process.

In another aspect, the invention provides a test wafer. The test wafer includes at least one sensor on a front side of the test wafer. The test wafer further includes at least one contact pad on a rear side of the test wafer. The test wafer further includes a conducting wire extending through the test wafer to electrically connect the sensor to the contact pad.

In another aspect, the invention provides an interface device. The interface device is capable of establishing electrical contact with a test wafer positioned on a supporting structure. The interface device includes a plurality of contact pins. Each contact pin being in contact with a corresponding contact pad of the test wafer when the test wafer is positioned on the supporting structure.

In another aspect, the invention provides a method of monitoring a semiconductor process. The method includes exposing a test wafer including at least one sensor to a semiconductor process. The method further includes transmitting signals from the sensor on the test wafer to circuitry. The method further includes processing the signals using the circuitry.

Among other advantages, the monitor system provides in-situ, real-time measurements of ion beam and wafer properties during an implantation process. This permits adjustment of various parameters, during the process, to produce the desired beam and wafer properties. For example, the plasma flood gun may be appropriately adjusted in response to data from the measurements to achieve an ion beam having a neutral charge. The system also collects data related to ion beam and wafer properties throughout a process cycle. The system, therefore, can evaluate how the properties vary with time. This information may indicate the time during a process cycle when adjustments need to be made to processing parameters to produce the desired conditions.

Furthermore, the monitor system utilizes a test wafer which has the same dimensions and is positioned in the chamber in the same location as a process wafer. Thus, measurements made by the monitor system are indicative of the conditions experienced by process wafers. The test wafer also may be loaded and removed from the process chamber using conventional wafer handling systems which facilitates conducting characterization measurements without disrupting the process. For example, a test wafer may be loaded at selected intervals with process wafers and measurements may be performed. The test wafer also includes no hard-wiring which may otherwise have problems transmitting electrical signals if exposed to the plasma and/or ion beam.

In addition, the monitor system can measure a variety of beam and beam-induced wafer properties including net wafer floating potential, net current density, flux uniformity, electron energy distribution, and displacement current.

The monitor system may also be used with other semiconductor processes and, in particular, processes utilizing an ion beam and/or plasma.

Other advantages, aspects, and embodiments will be apparent from the following detailed description when considered in conjunction with the accompanying figures.

DETAILED DESCRIPTION

The invention provides a monitor system and method used to evaluate semiconductor processes and systems such as ion implantation processes and systems. The monitor system may provide in-situ, real-time measurements of ion beam and wafer properties during implantation. The measurements may be used, for example, to characterize the efficiency of techniques used to neutralize the ion beam. Beam neutralization parameters may be adjusted, if needed, to improve beam and wafer properties for further processing.

Figure 1:
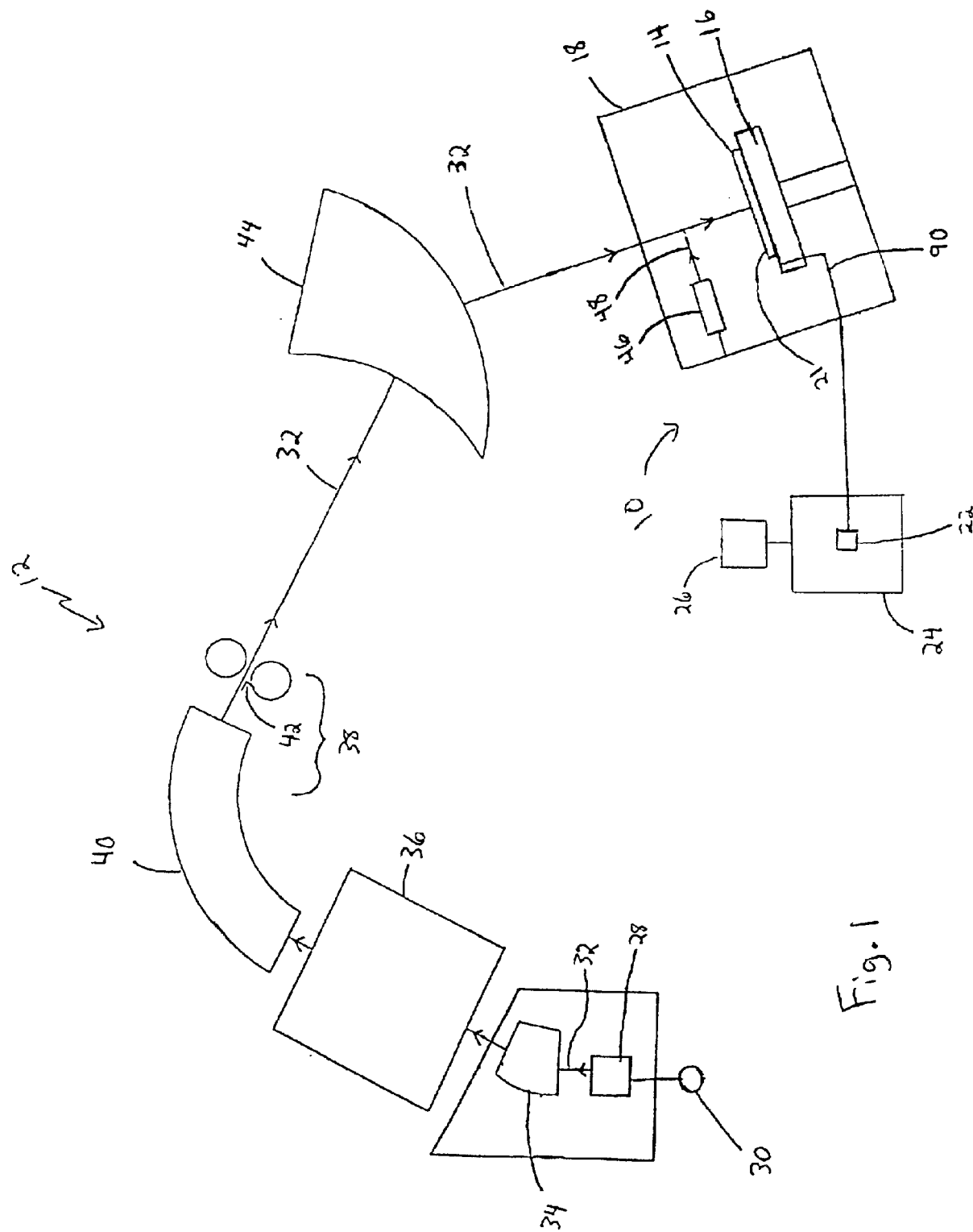
FIG. 1 schematically illustrates the monitoring system as a component of an ion implantation system according to one embodiment of the present invention.
Figure 2A:
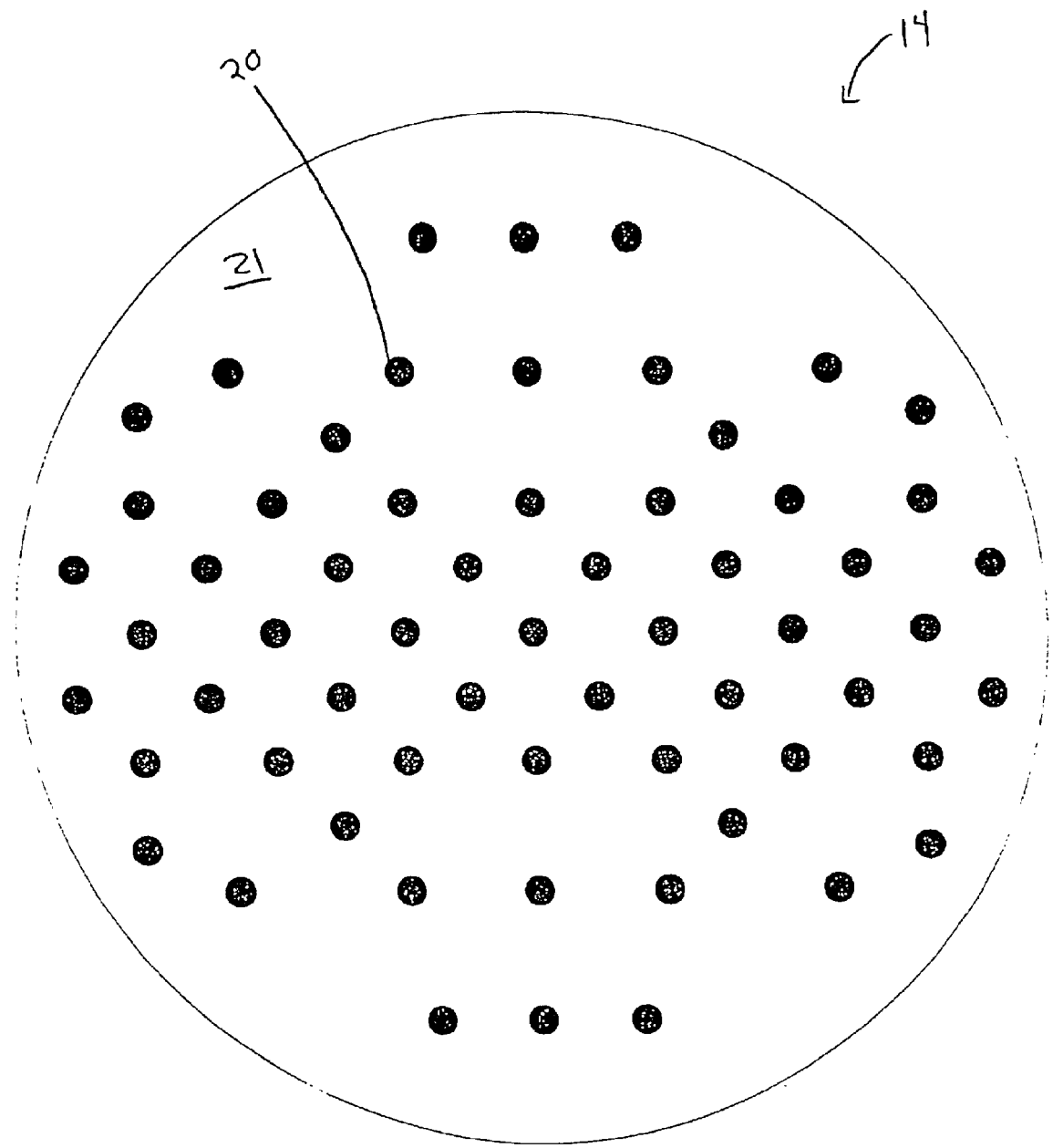
FIG. 2A is a view of a front side of a test wafer according to one embodiment of the present invention.

FIG. 1 schematically illustrates a monitor system 10 used to characterize an ion implantation system 12 according to one embodiment of the present invention. Monitor system 10 includes a test wafer 14 that is mounted on a supporting structure 16 (e.g., a platen or electrostatic chuck) within a process chamber 18 when evaluating an implantation process. As described further below, sensors 20 (FIG. 2A) formed on a front side 21 of the wafer are electrically connected to circuitry 22 external of chamber 18 which determines ion beam and wafer properties. The circuitry may be coupled to a data acquisition system 24 which can include a monitor 26 for displaying the data. Acquisition system 24, in some cases, may also be connected to various components of the implantation system so that outputs from the acquisition system may be used to control process parameters.

Ion implantation system 12 includes an ion source 28 connected to a dopant gas supply 30. Gas from supply 30 is introduced into ion source 28 and is ionized to generate positive ionic species and electrons. The positive ionic species are accelerated to form an ion beam 32 which, typically, exits the ion source with a net positive charge due to a greater charge contribution from the positive ions as compared to electrons in the beam. Downstream of ion source 28, implantation system 12 can include a source filter 34 which removes undesired species from the beam followed by an acceleration/deceleration column 36 which accelerates/decelerates ions in the beam to a desired energy. Implantation system 12 further includes a mass analyzer 38 which removes energy and mass contaminants from ion beam 32 through the use of a dipole analyzing magnet 40 and a resolving aperture 42. The implant system includes an angle corrector magnet 44 to deflect ions in ion beam 32 to produce a beam having parallel ion trajectories. A plasma flood gun 46 is positioned inside chamber 18.and may be used, if desired, to introduce electrons 48 into ion beam 32 to neutralize the charge of the beam.

To monitor wafer and beam properties during implantation, test wafer 14 is loaded into process chamber 18 using a conventional wafer handling system (not shown). Ion beam 32 is generated by ion source, is transported through the implantation system 12, and impinges upon test wafer 14. In response to the impinging beam, sensors 20 (FIG. 2) on test wafer 14 provide electrical signals to circuitry 22 which processes the signals to determine properties related to the ion beam and wafer. Data acquisition system 24 displays the property data in real-time to provide an operator with information that characterizes the implantation system and process. Such information, for example, can be used to assess the efficiency of beam neutralization techniques, if utilized. If required, adjustments can made to process parameters to provide desired operating conditions for further processing of wafers. For example, one or more of the plasma flood gun parameters may be adjusted such as arc current, arc voltage, net emission current and gas (e.g., Xe) flow. In some embodiments, though not all, data acquisition system 24 may provide output signals in response to the property data to control the operation of various components as described further below.

Though illustrated in conjunction with an ion implantation system, it is to be understood that monitor system 10 may be utilized with any other suitable type of semiconductor system or process. Suitable systems include, but are not limited to, systems with process chambers in which a wafer is exposed to an ion beam or plasma. Monitor system 10 may be utilized with any ion implantation system, including implantation systems having different configurations than the embodiment illustrated in FIG. 1. Monitor system 10 may be particularly usefull in implant systems 12 that generate ion beams having a net positive (or negative) charge and that employ techniques to neutralize the beam. Such implant systems may generate a high current ribbon beam and/or spatially large ion beams and plasmas. However, monitor system 10 may also be utilized to characterize ion implanters that generate a neutral ion beam and/or do not employ techniques to neutralize the beam. It should be understood that monitor system 10 may measure any property associated with implantation. Such properties may or may not be related to the ion beam charge or to wafer charging.

Referring to FIGS. 2A–2D, one illustrative embodiment of test wafer 14 is schematically shown. Test wafer 14 may be formed using a standard silicon substrate 50 (e.g., n-type, p-type, undoped) that is processed to include different functional layers and features. Test wafer 14 generally has a structure that, when exposed to an ion beam, can generate and transmit signals related to the ion beam. In the illustrative embodiment, each sensor 20 on front side 21 (FIG. 2A) of the test wafer generates a signal in response to the ion beam and transmits the signal to corresponding contact pads 52 on a back side 54 (FIG. 2B) of the test wafer via a conductive wire 56 that extends through the wafer thickness. As described further below, each signal pathway through the wafer (from sensor to wire to contact pad) is surrounded by an insulating material 57 that electrically isolates the pathway from adjacent signal pathways. In some cases, particularly in systems in which the wafer is electrostatically clamped to supporting structure 16, test wafer 14 also may include a conducting layer 58 that is grounded to capacitively de-couple the sensors from the supporting structure. Grounded conducting layer 58 is also insulated from the other conductive components by insulating material.

It is generally advantageous to use test wafers 14 in implant systems that have the same dimensions as wafers processed by the implant system to accurately monitor the conditions. Therefore, test wafer 14 may have the dimensions of any standard process wafer such as a 4 inch diameter, 8 inch diameter, and the like. It should be understood that test wafer may have other dimensions if desired for a particular monitor method.

Sensors 20 may have any structure that can generate an electrical signal in response to the ion beam. In the illustrative embodiment, sensors 20 are made of conducting materials though other types of sensors may also be used. In one set of preferred embodiments, the sensors comprise aluminum. Conducting material may be deposited and/or patterned using standard techniques known in the art to form sensors 20 at selected locations on the surface. Generally, it is desirable to locate sensors at a variety of positions to provide coverage over the majority of the surface area of front side 21, as shown, to accurately monitor process conditions. Particularly, it is desirable to have sensors cover areas of test wafer 14 that correspond to areas on process wafers which include devices. Locating sensors over a large surface area on the wafer is especially useful when characterizing processes and systems that utilize large area beams and/or plasmas. However, it is also possible to position sensors only over a selected region of the front side wafer surface area. The size of sensors 20 is generally not constrained, though the sensors should have a large enough surface area to send a detectable electrical signal and a small enough surface area to avoid contacting other sensors. In the illustrative embodiment, the sensors have a circular shape and a diameter between about 0.010 inches and about 0.25 inches. Sensors having other dimensions may also be utilized. In some embodiments of test wafer 14, a number of sensors may have different dimensions. It should be understood that the dimensions and location of sensors depend upon the particular the process which is being monitored.

Figure 2B:
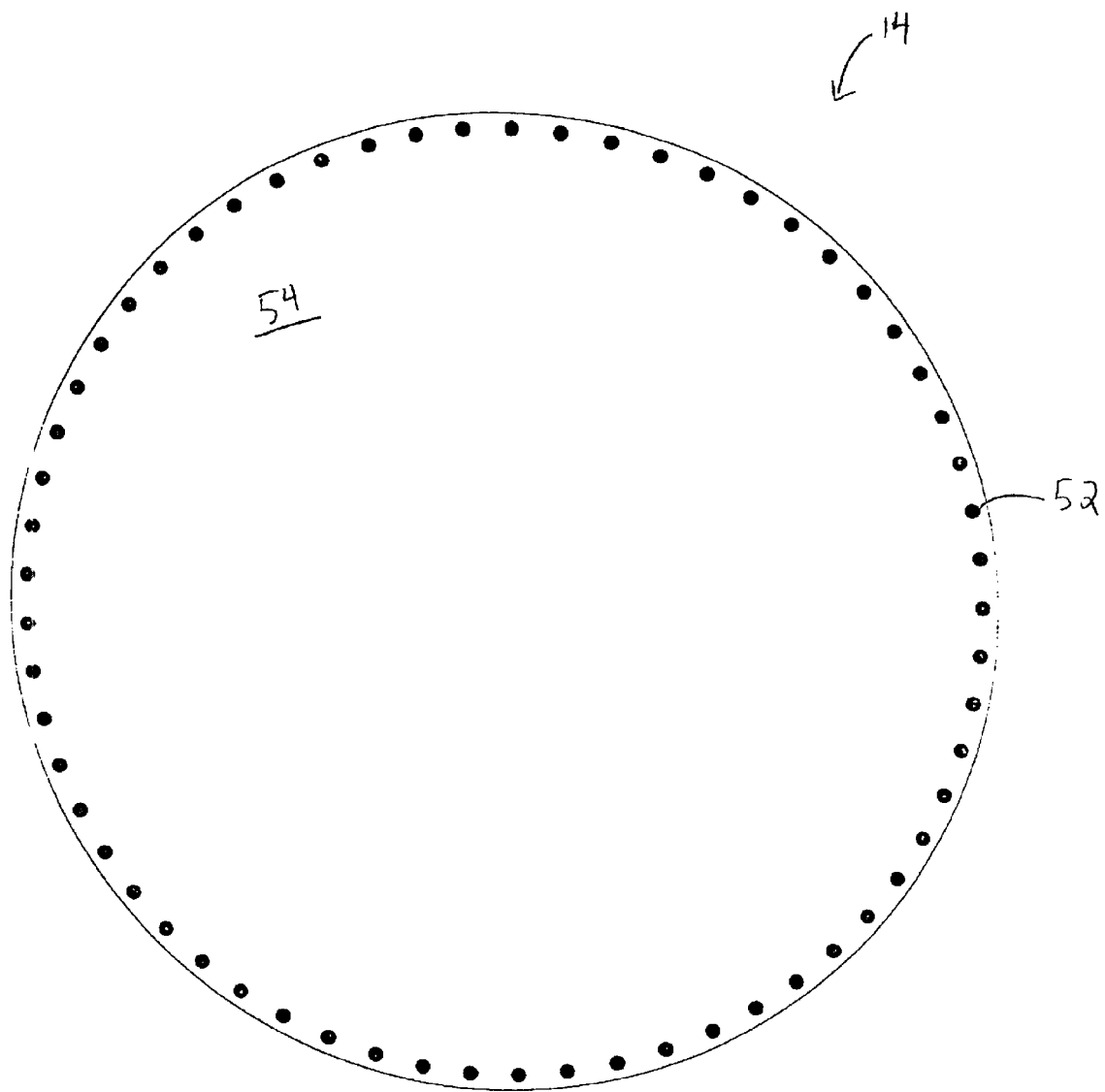
FIG. 2B is a view of a back side of the test wafer of FIG. 2A.
Figure 2C:
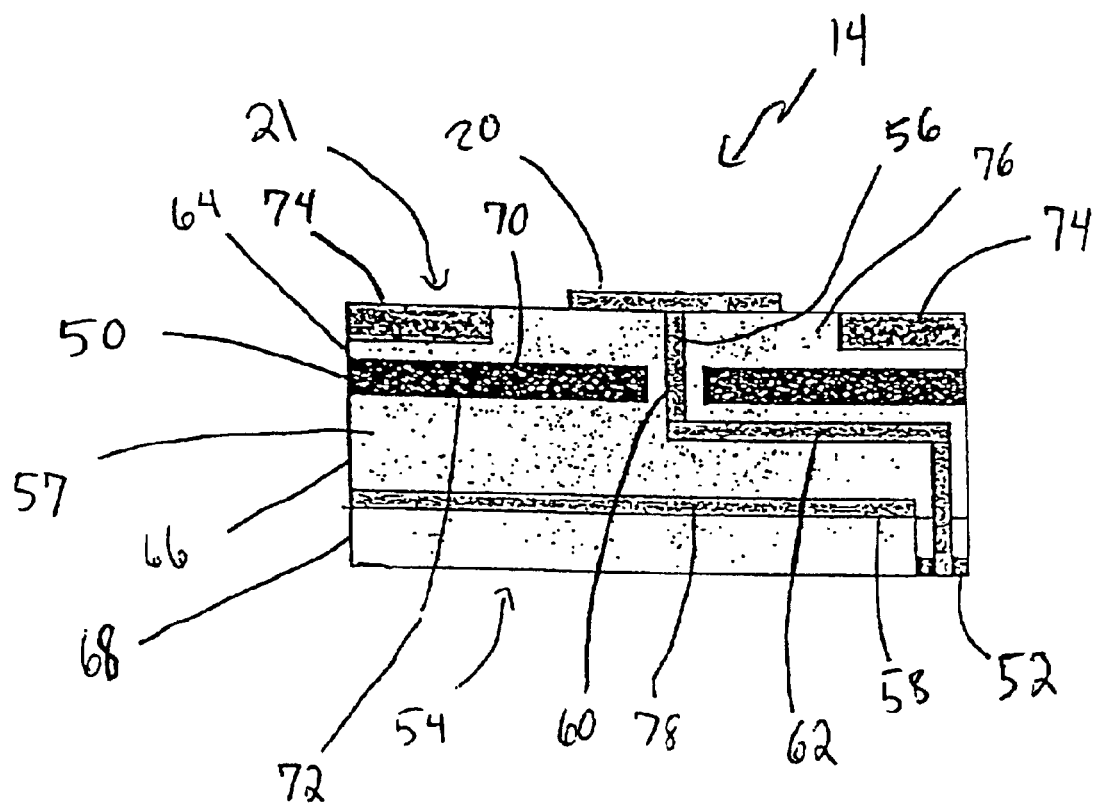
FIG. 2C is a cross-section of a portion of the test wafer of FIG. 2A.
Figure 2D:
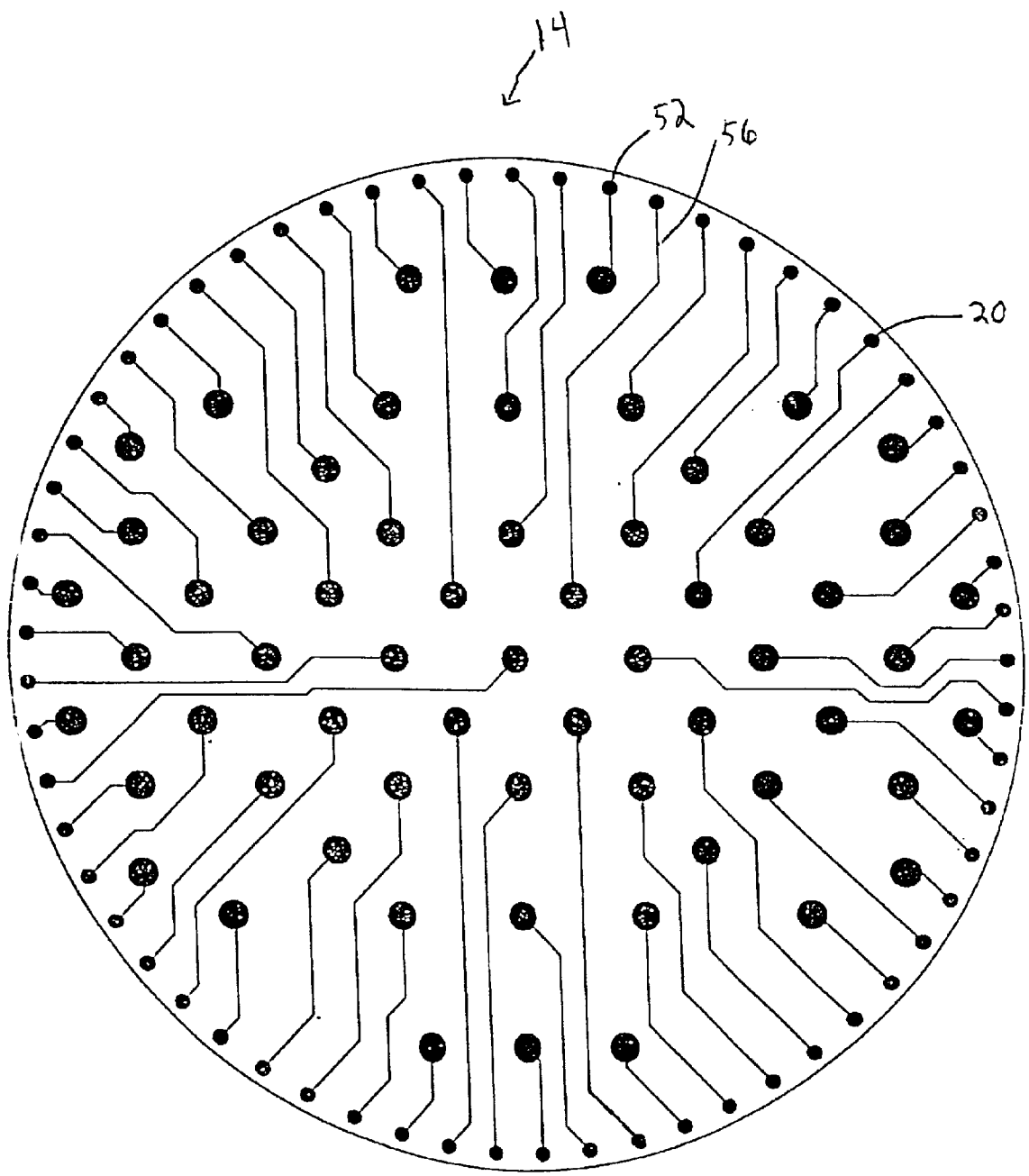
FIG. 2D is a top view of the test wafer of FIG. 2A illustrating the connection between sensors on the front side and of the wafer contact pads on the back side of the wafer.

Wires 56 may be made of any conductive material that suitably transmits electrical signals from sensors 20 to contact pads 52. In one set of preferred embodiments, the wires comprise aluminum. In some cases, the wires may be formed at least in part of aluminum traces buried, for example, in an oxide layer. Wires 56 generally connect a single sensor to a single contact pad. The wires may follow any path through the wafer to connect respective sensors to contact pads. The actual wire path depends upon the structure of test wafer 14 and may also be constrained by processing requirements. As illustrated in FIG. 2C, the wire path includes vertical portions 60 (e.g., perpendicular to the wafer plane) and horizontal portions 62 (e.g., parallel to the wafer plane). In some cases, different processing steps may be used to form different portions of the wires. For example, vertical portions 60 may be formed by laser-drilling holes through the wafer which are subsequently filled with conductive material using a deposition technique, while horizontal portions 62 may be formed by depositing conductive material on an underlying layer. Test wafer 14 generally includes wires 56 having a variety of lengths, as illustrated, due to varying distances between different sensor and contact pad pairs. The thickness of the wires generally is not critical, though wires should have a sufficient thickness to conduct electrical signals.

Insulating material 57 may be any material or combination of materials capable of insulating the conducting components of test wafer (e.g., sensors, wires, contacts, conducting layer). Suitable insulating materials include silicon oxide. Silicon oxide, for example, may be deposited using techniques known in the art such as thermal growth and spin-on-glass (SOG) techniques, amongst others. The technique utilized may depend upon the area of deposition. For example, the insulating material that forms lateral layers may be deposited using thermal growth or CVD techniques. Insulating material that surrounds wires, for example, in laser-drilled holes may be provided using SOG techniques which enables the insulating material to fill the holes.

In the illustrative embodiment, insulating material 57 is provided as a series of layers. A first insulating layer 64 is formed on a top side 70 of substrate 50. In certain embodiments, first insulating layer 64 may include undoped polysilicon regions 74 formed therein. Un-doped polysilicon regions 74 may optionally be provided, for example, to increase electron conductivity away from front side 21. In some cases, when provided, polysilicon region 74 may be connected to ground (via conducting layer 78) or, in other cases, isolated by insulating layer 64. A second insulating layer 66 is formed upon a bottom side 72 of substrate 56 and isolates grounded conducting layer 58 and a portion of each conducting wire. As shown, a third insulating layer 68 is formed upon a bottom side 78 of conducting layer 58 to isolate the conducting layer and contact pads 52. Third insulating layer 68 covers backside 54 of test wafer 14 with the exception of contact pads 52. As shown, individual insulating layers may be connected with regions of insulating material formed, for example, around wires 56.

It should be understood in other embodiments insulating material 57 may be provided in a different structure, other than a series of layers, to isolate the conductive components.

Grounded conducting layer 58, when provided, may be made of any suitable conducting material. In one set of preferred embodiments, the conducting layer comprises aluminum. The material of conducting layer 58 may be deposited using known techniques. In the illustrative embodiment, conducting layer 58 extends over most of the second insulating layer with the exception of the area of above contact pads 52 to provide access to the contact pads for wires 56. It should be understood that certain embodiments of the test wafer may not include a grounded conducting layer, particularly when electrostatic clamping is not used to hold the test wafer to supporting structure 16,.

Figure 3A:
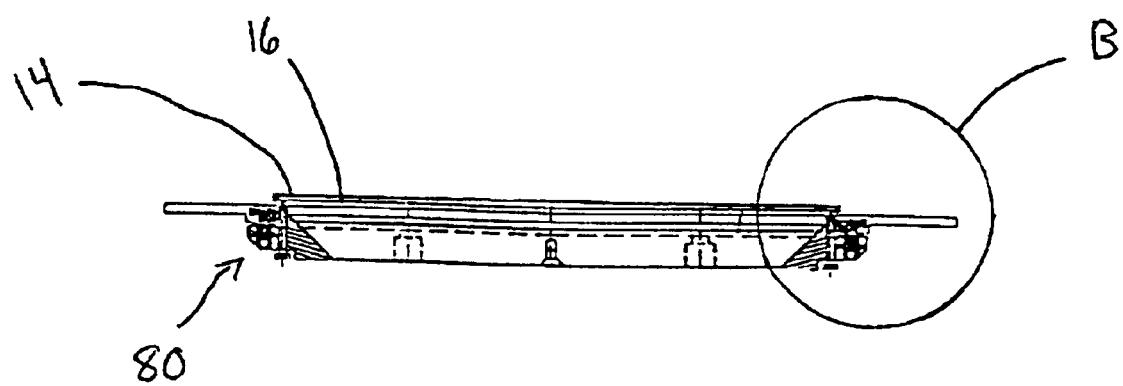
FIG. 3A is a cross-sectional view of an interface device that connects the test wafer with external circuitry according to one embodiment of the present invention.
Figure 3B:
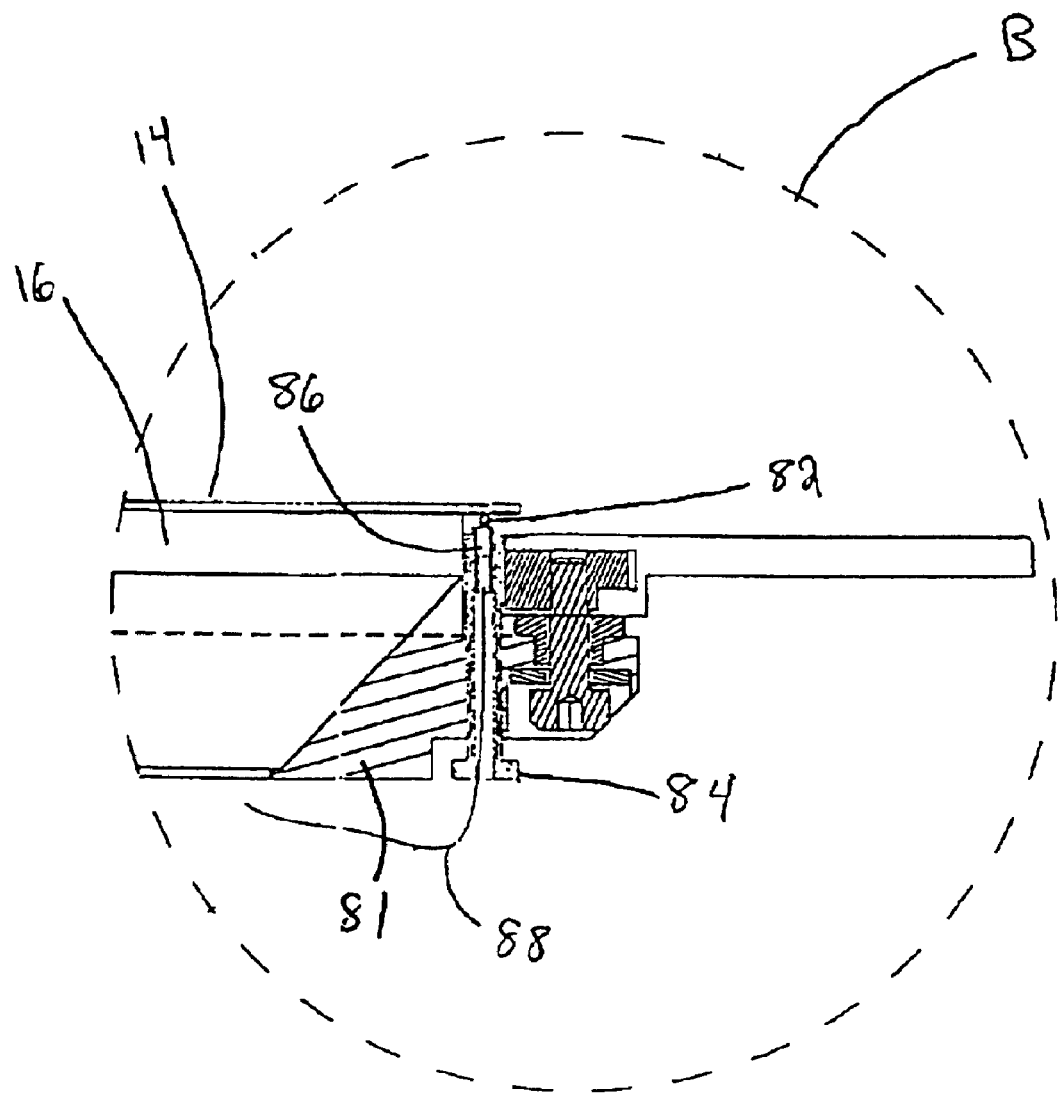
FIG. 3B is an enlarged view of section B of the interface device of FIG. 3A.

Contact pads 52 may be made of any material that suitably conducts electrical signals transmitted from the sensor. In certain preferred embodiments, the contact pads may comprise copper which has a high conductivity and may be deposited on back side 54 because it is not exposed to the ion beam. Conductive material may be deposited and/or patterned using known techniques to form contact pads at specific locations on back side 54 of test wafer 14. Contact pads are located in positions that are accessible by an interface device 80 (FIGS. 3A–3B), which transmits signals from the pads to external circuitry 22, as described further below. As illustrated in FIG. 2B, the contact pads are located along the periphery of the back side 54. The illustrative arrangement of pads may be preferable in certain cases to provide easy accessibility for an interface device 80 (FIGS. 3A–3B). The contact pads are sized to transmit signals to the interface device and provide reliable contact to the interface device. In the illustrative embodiment, the contact pads have a circular cross-section with a diameter of between about 0.010 inches and about 0.150 inches. The particular dimensions of the contact pad are not critical, and contact pads having other dimensions may be utilized. It should be understood that the placement and dimensions of the contact pads may depend upon the particular structure of the test wafer and the interface device.

The monitor system includes a mechanism for transmitting signals from contact pads to external circuitry. According to one embodiment of the invention, interface device 80 shown in FIGS. 3A–3B may be used to provide connection between test wafer 14 and external circuitry 22. Interface device 80 has an annular shape and may be mounted to supporting structure 16, for example, using a mounting ring 81 which can be secured around a peripheral portion of the supporting structure. An array of contact pins 82 on the interface device are arranged so that each contact pin touches a corresponding contact pad 52 when the wafer is clamped upon supporting structure 16 by electrostatic clamping, for example. Contact pins 82 are made of a conductive material and may be spring-loaded to provide a similar contact force between each pin and its respective pad. An adjuster 84 coupled to contact pins 82 may be provided to adjust the pin spring tension as desired for the particular process. Contact pins 82 are surrounded with an isolator 86 that provides electrical isolation from other components. Each contact pin 82 is connected to a conductive lead 88, such as a wire, which is capable of carrying signals from the pin. Individual leads may be combined to form a cable 90 (FIG. 1) which exits process chamber 18 through a hermetically sealed electrical feedthrough. Upon exiting the chamber, cable 90 may be connected to electrical circuitry 22 to process signals from pins 82.

Figure 4:
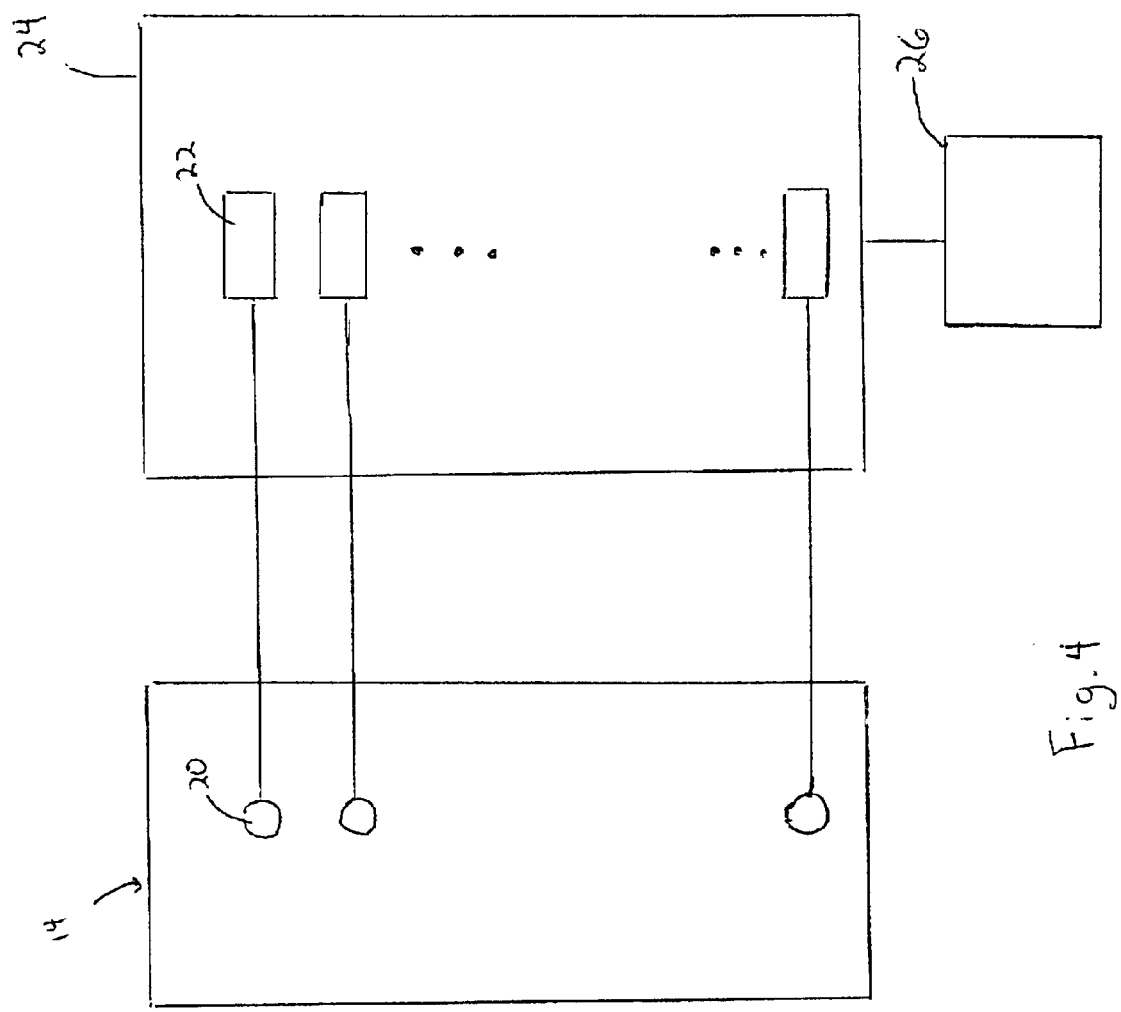
FIG. 4 schematically illustrates the electrical connection between the test wafer and circuitry according to one embodiment of the present invention.

FIG. 4 schematically illustrates the connection between sensors 20 on test wafer 14 and circuitry 22 according to one embodiment of the invention. Each sensor 20 on the test wafer is connected, as described above, to a respective circuit 22 so that electrical signals from each sensor may be separately processed. The signals processed from each circuit 22 provides separate inputs to data acquisition system 24 so that data may be obtained from each sensor.

The design of electrical circuitry 22 utilized in monitor system (FIG. 1) depends upon the property or properties being measured. The monitor system may include one or more types of circuitry connected to each sensor, with each type of circuit measuring a different property. This enables the monitor system to evaluate one or more properties simultaneously.

Figure 5:
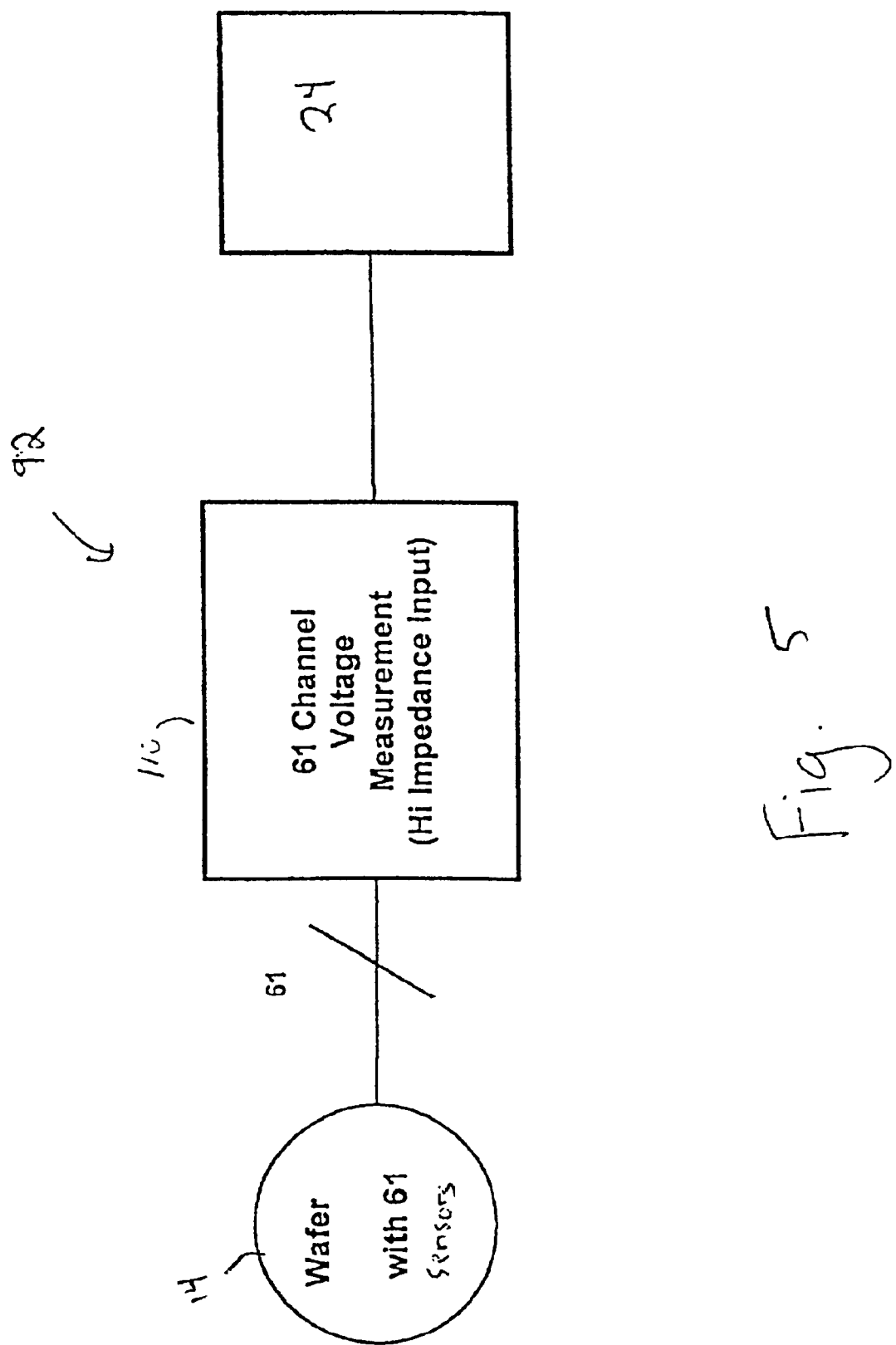
FIG. 5 is a schematic diagram of circuitry used to measure net floating potential according to one embodiment of the present invention.

FIG. 5 is a schematic of a circuit 92 for measuring the beam-induced net floating potential as known to one of ordinary skill in the art Circuit 92 includes a high impedance input voltage measurement circuit 110 for each sensor on the test wafer. The voltage measurement circuit 110 may, for example, include a high input impedance amplifier followed by an analog-to-digital converter which supplies a digital value to data acquisition system 24.

The net floating potential measured by the circuit of FIG. 5 is a measure of the ion beam charge. Floating potential is measured at each sensor location with respect to facility ground and the net floating potential between sites may be determined by the mathematical difference. A net floating potential of zero (or approximately zero) is representative of a neutral ion beam. A high net floating potential can damage devices on process wafers, thus, it is desirable to maintain the net floating potential below a value which may cause damage (e.g., greater than 5 Volts). During characterization, if monitor system 10 detects a high net floating potential, process parameters may be adjusted to improve the charge neutrality of the beam. For example, plasma flood gun 46 parameters may be adjusted to increase the efficiency of charge neutralization.

Figure 6:
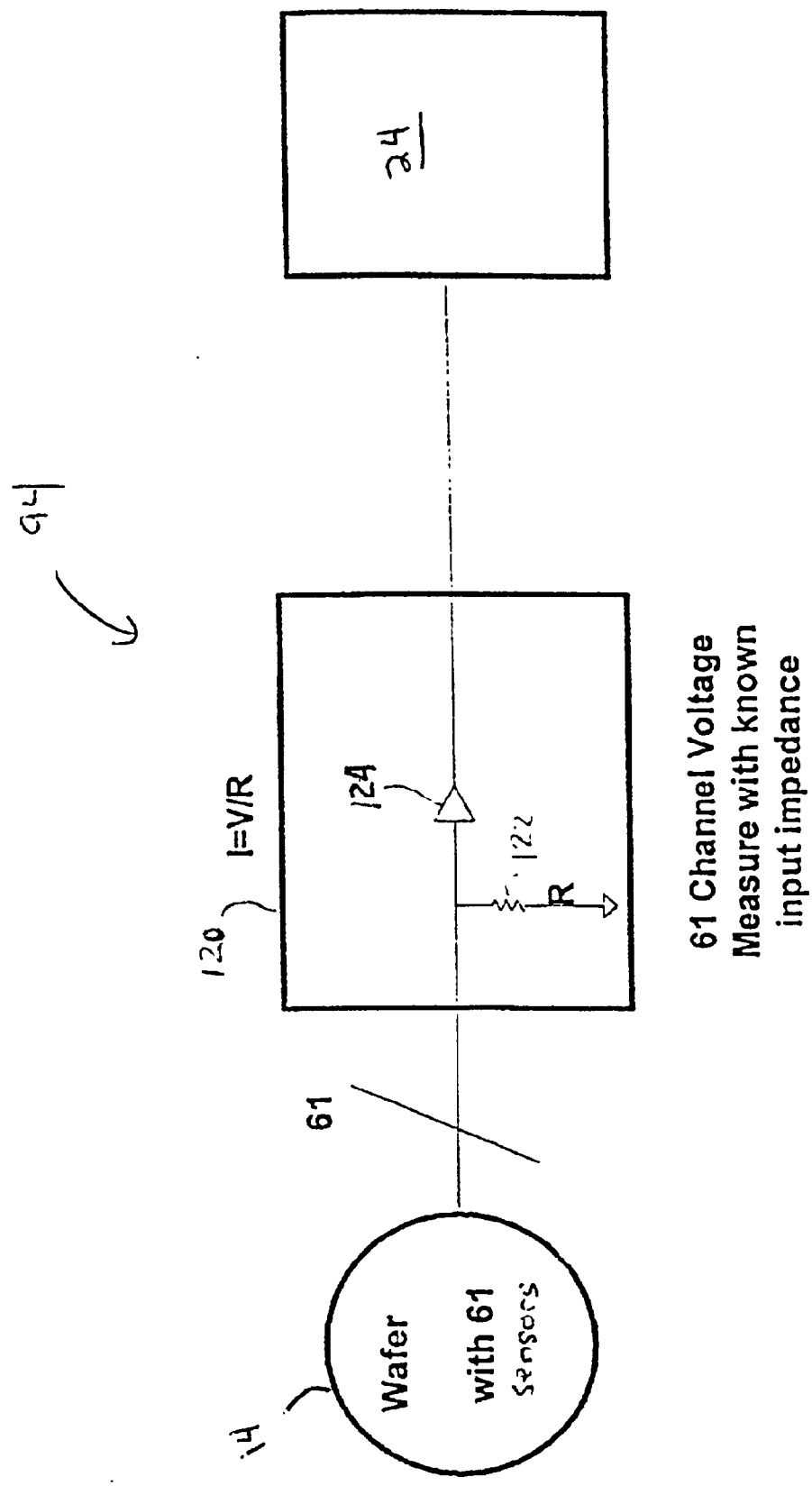
FIG. 6 is a schematic diagram of circuitry used to measure net current density according to one embodiment of the present invention.

FIG. 6 is a schematic of a circuit 94 for measuring the beam-induced net current density as known to one of ordinary skill in the art. Circuit 94 includes a voltage measurement circuit 120 having a known input impedance. The sensor output on the test wafer is connected to a resistor 122 and to the input of an amplifier 124. The voltage at the input of amplifier 124 is representative of the sensor current The output of amplifier 124 is provided to data acquisition system 24. The voltage measurement circuit 120 may optionally include an analog-to-digital converter (not shown).

The net current density is also a measure of the ion beam charge. For example, a net current density of zero (or approximately zero) is representative of a neutral ion beam. A high net current density can induce a high floating potential (e.g., greater than 5 Volts) which may cause damage to devices. Thus, it is desirable to maintain a low net current density. During characterization, if monitor system 10 detects a high net current density, process parameters may be adjusted to improve the charge neutrality of the beam. For example, plasma flood gun 46 parameters may be adjusted to increase the efficiency of charge neutralization.

Figure 7:
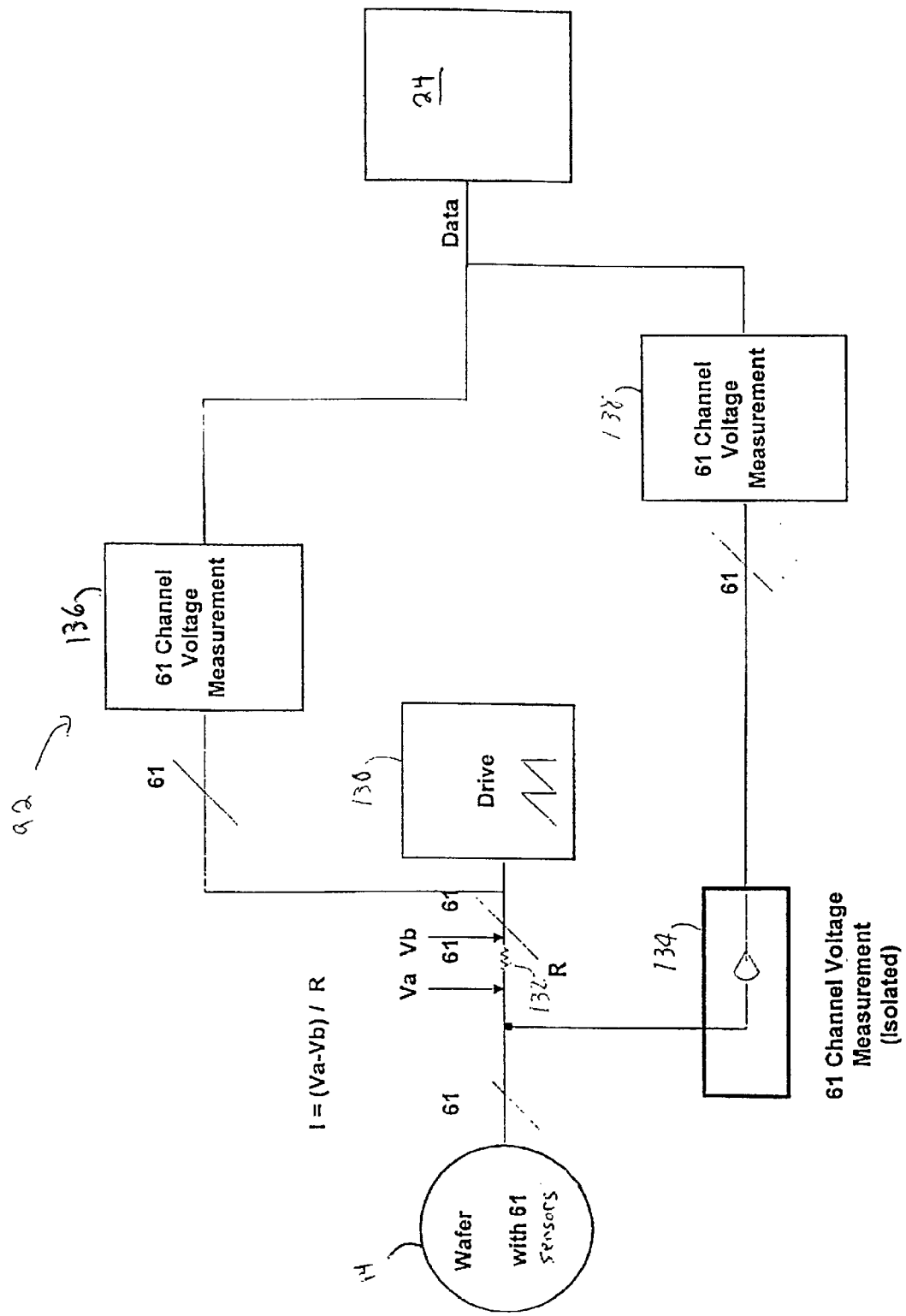
FIG. 7 is a schematic diagram of circuitry used to measure electron flow to a voltage-driven sensor site according to one embodiment of the present invention.

FIG. 7 is a schematic of a circuit 96 for measuring electron flow to a voltage-driven sensor site at the wafer surface. Such a circuit is conventionally referred to as a flat Langmuir probe. Circuit 96 includes a drive voltage generator 130, a resistor 132, an isolation amplifier 134 and voltage measurement circuits 136 and 138. A drive voltage generator applies a voltage wave form, such as a ramp voltage, to resistor 132. A voltage $V_a$ the output of the sensor is supplied through amplifier 134 to voltage measurement circuit 138. A voltage $V_b$ is supplied to voltage measurement circuit 136. The outputs of voltage measurement circuits 138 and 136 represent voltages $V_a$ and $V_b$ respectively. The voltage difference $V_a-V_b$ is representative of a sensor current.

Circuit 96 provides at each sensor site a measurement of electron flow to the voltage-driven sensor site (referenced to facility ground) so that a number of properties may be calculated. Such properties include electron energy, electron temperature, electron density. Because each sensor site provides a measurement, each of these properties may be mapped across the front side of wafer. It is desirable to have low energy electrons (less than 1 eV) distributed uniformly across the front side. High electron energies can result in device damage. During characterization, if monitor system 10 detects high electron energies, process parameters may be adjusted to improve the charge neutrality of the beam. For example, ion beam parameters and plasma flood gun 46 parameters may be adjusted to increase the efficiency of charge neutralization.

Figure 8:
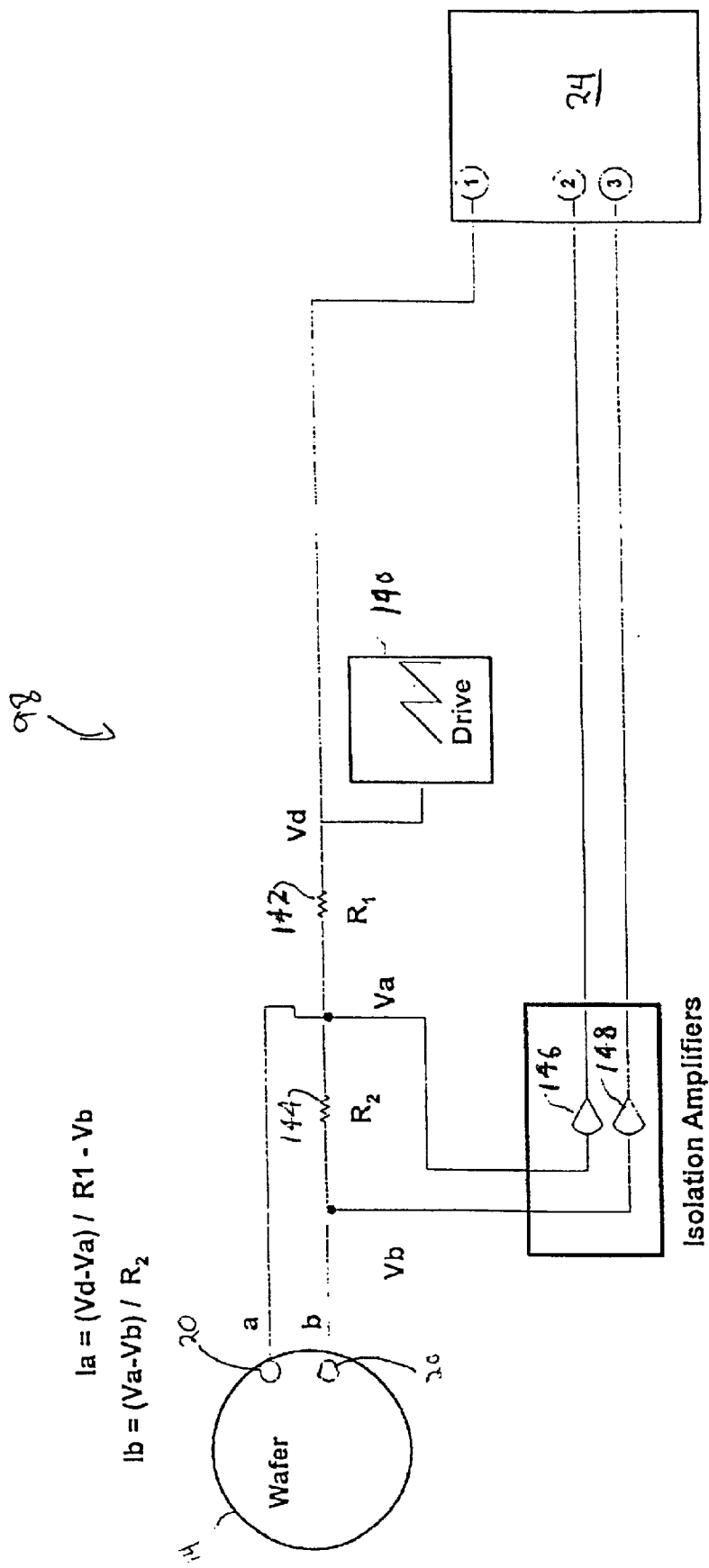
FIG. 8 is a schematic diagram of circuitry used to measure electron flow between two sensor sites according to one embodiment of the present invention.

FIG. 8 is a schematic of a circuit 98 for measuring electron flow between two sensors (one sensor site voltage-driven referenced to another) as known to one of ordinary skill in the art. Circuit 98 includes a drive voltage generator 140, resistors 142 and 144, and isolation amplifiers 146 and 148. The drive voltage generator 140 applies a wave form, such as a ramp voltage, to resistors 142 and 144. A first sensor is connected to the input of amplifier 146 and the second sensor is coupled to the input of amplifier 148.

It is desirable to have a low electron energy relationship between sensor sites as determined from the measurement of circuit 98. In particular, during implantation, it is desireable to have a low electron energy relationship between a first sensor exposed to the beam and a second sensor not exposed to the beam. High electron energy flow between sensor sites may cause device damage. During characterization, if monitor system 10 detects a high electron energy relationship, process parameters may be adjusted to improve the charge neutrality of the beam. For example, ion beam parameters and plasma flood gun 46 parameters may be adjusted to increase the efficiency of charge neutralization.

It should be understood that the circuit diagrams illustrated in FIGS. 5–8 are only provided as exemplary circuitry which may be part of monitor system 10. Monitor system 10 may include other types of circuitry to determine other properties. Any type of circuitry known in the art that is used to determine beam or wafer properties may be utilized. It also should be understood that the properties discussed herein may be measured using other types of circuitry than the schematic circuit diagrams illustrated in FIGS. 5–8.

As described above, circuitry 22 may be coupled to data acquisition system 24. It should be understood that the circuitry may be a component of the data acquisition system or a separate component that is connected to the data acquisition system. Data acquisition system 24 may be any of the type known in the art. A preferred data acquisition system is a computer. Monitor 24 may be utilized with the data acquisition system to display property data in real-time. However, a monitor is not required in all cases. In some cases, data acquisition system may store data for later analysis without displaying it. In other cases, data acquisition system may display data without storing it.

In certain embodiments, data acquisition system 24 may also function as a controller. When functioning as a controller, data acquisition system 24 may send output signals that control various process parameters in response to property measurements. For example, an output signal may be sent to control process parameters of plasma flood gun 46 (e.g., arc current, arc voltage, net emission current and gas (e.g., Xe) flow) to increase the efficiency of beam charge neutralization. It should be understood that a separate controller coupled to the data acquisition system may also be provided to control process parameters.

Those skilled in the art would readily appreciate that all parameters listed herein are meant to be exemplary and that the actual parameters would depend upon the specific application for which the monitoring system and method of the invention are used. It is, therefore, to be understood that the foregoing embodiments are presented by way of example only and that, within the scope of the appended claims and equivalents thereto the invention may be practiced otherwise than as specifically described.

What is claimed is:

1. Monitor system for a semiconductor process comprising:
   a test wafer including at least one sensor, the test wafer being positionable on a supporting structure in a process chamber of a semiconductor processing system;
   an interface including at least one contact electrically connectable to the sensor when the test wafer is positioned on the supporting structure; and
   circuitry electrically colmectable to the contact and designed to process signals transmitted from the sensor;
   wherein the circuitry measures at least one property selected from the group consisting of net floating potential, net current density, electron energy distribution at the front side of the test wafer, and displacement current.

2. The monitor system of claim 1, wherein the test wafer includes a plurality of sensors on a front side of the test wafer.

3. The monitor system of claim 2, wherein the sensors are distributed over a majority of the surface area of the front side of the test wafer.

4. The monitor system of claim 1, wherein the test wafer includes a plurality of contact pads on a back side of the test wafer.

5. The monitor system of claim 4, wherein each contact pad is electrically connected to a corresponding sensor via a wire that extends through the test wafer to define a signal pathway.

6. The monitor system of claim 5, wherein the test wafer comprises an insulating material surrounding each signal pathway.

7. The monitor system of claim 4, wherein the interface includes a plurality of contact pins, each contact pin being in contact with a corresponding contact pad of the test wafer when the test wafer is positioned on the supporting structure.

8. The monitor system of claim 7, wherein the contact pins are spring-loaded.

9. The monitor system of claim 7, wherein each contact pin is connected to an electrical lead that is connected to the circuitry.

10. The monitor system of claim 1, wherein the interface is mountable to the supporting structure.

11. The monitor system of claim 1, wherein the circuitry is external of the process chamber.

12. The monitor system of claim 1, wherein the circuitry is designed to process signals transmitted from the sensor to determine one or more properties related to the semiconductor process.

13. The monitor system of claim 12, wherein one or more of the properties characterizes the efficiency of an ion beam neutralization process.

14. The monitor system of claim 1, further comprising a data acquisition system associated with the circuitry.

15. The monitor system of claim 14, wherein the data acquisition system includes a monitor capable of displaying outputs of the circuitry in real-time with the semiconductor process.

16. The monitor system of claim 14, wherein the data acquisition system is connectable to the semiconductor processing system and output signals from the data acquisition system control one or more process parameters.

17. The monitor system of claim 16, wherein output signals from the data acquisition system control one or more process parameters of a plasma flood gun in the semiconductor processing system constructed and arranged to introduce electrons into an ion beam.

18. The monitor system of claim 1, wherein the semiconductor processing system comprises an ion implantation system.

19. The monitor system of claim 1, wherein the signals are transmitted from the sensor to the circuitry in real-time with the semiconductor process.

* * * * *